(12) United States Patent
Krajewski

(10) Patent No.: US 9,866,168 B2
(45) Date of Patent: Jan. 9, 2018

(54) FLEXIBLE PHOTOVOLTAIC MODULES HAVING JUNCTION BOX SUPPORTING FLAPS

(71) Applicant: Apollo Precision (Kunming) Yuanhong Limited, Kunming, Yunan (CN)

(72) Inventor: Todd Krajewski, Mountain View, CA (US)

(73) Assignee: Beijing Apollo Ding Rong Solar Technology Co., Ltd., Beijing (CN)

( * ) Notice: Subject to any disclaimer, the term of this patent is extended or adjusted under 35 U.S.C. 154(b) by 470 days.

(21) Appl. No.: 14/252,321

(22) Filed: Apr. 14, 2014

(65) Prior Publication Data

US 2014/0305495 A1 Oct. 16, 2014

Related U.S. Application Data

(60) Provisional application No. 61/811,461, filed on Apr. 12, 2013.

(51) Int. Cl.
*H01L 31/0203* (2014.01)
*H02S 40/34* (2014.01)
(Continued)

(52) U.S. Cl.
CPC ........ *H02S 40/34* (2014.12); *H01L 31/02013* (2013.01); *H01L 31/048* (2013.01); *Y02E 10/50* (2013.01)

(58) Field of Classification Search
CPC ............. H01L 31/045; H01L 31/02013; H01L 31/048
See application file for complete search history.

(56) References Cited

U.S. PATENT DOCUMENTS

| 5,482,569 A | 1/1996 | Ihara et al. |
| 6,066,796 A | 5/2000 | Itoyama et al. |
| (Continued) | | |

FOREIGN PATENT DOCUMENTS

WO 2010/014941 2/2010

OTHER PUBLICATIONS

Aitken et al., U.S. Appl. No. 61/515,042 (dated 2011).*
(Continued)

*Primary Examiner* — Jayne Mershon
(74) *Attorney, Agent, or Firm* — Weaver Austin Villeneuve & Sampson LLP

(57) ABSTRACT

Provided are flexible photovoltaic modules having flaps for supporting junction boxes. Junction boxes are used for making electrical connections to photovoltaic cells sealed inside the modules. A flap may be formed by one or two flexible sealing sheets extending beyond the boundary of the photovoltaic cells. A junction box is attached to the front surface of the flap. In certain embodiments, a flap is formed by one sealing sheet, such as a back side sheet. Materials of the back side sheet may be different from materials of the front side sheet and be selected to ensure support to the junction box. Additional support to the junction box may be provided by extending one of its edges in between the two sealing sheets. This edge extension or other features may be used for mechanical protection of electrical leads extending between the junction box and photovoltaic cells.

20 Claims, 6 Drawing Sheets

(51) Int. Cl.
*H01L 31/02* (2006.01)
*H01L 31/048* (2014.01)

(56) References Cited

U.S. PATENT DOCUMENTS

| | | | |
|---|---|---|---|
| 8,158,450 B1* | 4/2012 | Sheats | H02S 40/36 |
| | | | 136/259 |
| 9,231,123 B1 | 1/2016 | Sherman | |
| 2004/0040619 A1 | 3/2004 | Dehn et al. | |
| 2005/0061360 A1 | 3/2005 | Horioka et al. | |
| 2006/0054213 A1 | 3/2006 | Baret et al. | |
| 2006/0219291 A1 | 10/2006 | Hikosaka et al. | |
| 2008/0156365 A1 | 7/2008 | Scholz et al. | |
| 2008/0271774 A1 | 11/2008 | Kalkanoglu et al. | |
| 2009/0114261 A1 | 5/2009 | Stancel et al. | |
| 2010/0018135 A1 | 1/2010 | Croft et al. | |
| 2010/0144170 A1* | 6/2010 | Maebashi | H01R 4/22 |
| | | | 439/76.2 |
| 2010/0275976 A1 | 11/2010 | Rubin et al. | |
| 2011/0146792 A1 | 6/2011 | Wu et al. | |
| 2011/0232963 A1 | 9/2011 | Kono et al. | |
| 2012/0152349 A1* | 6/2012 | Cao | H01L 31/048 |
| | | | 136/259 |
| 2012/0291845 A1* | 11/2012 | Hatakeyama | B32B 27/20 |
| | | | 136/244 |
| 2013/0169056 A1 | 7/2013 | Sherman et al. | |
| 2014/0158201 A1* | 6/2014 | Aitken | H01L 31/0488 |
| | | | 136/259 |
| 2014/0305493 A1 | 10/2014 | Dhir et al. | |
| 2014/0305494 A1 | 10/2014 | Dhir | |

OTHER PUBLICATIONS

Office Action dated Jul. 14, 2015, issued in U.S. Appl. No. 14/252,246.
Final Office Action dated Mar. 30, 2016, issued in U.S. Appl. No. 14/252,246.
Office Action dated Oct. 25, 2016, issued in U.S. Appl. No. 14/252,246.
Office Action dated Apr. 8, 2016, issued in U.S. Appl. No. 14/252,282.
Final Office Action dated Jan. 6, 2017, issued in U.S. Appl. No. 14/252,282.

* cited by examiner

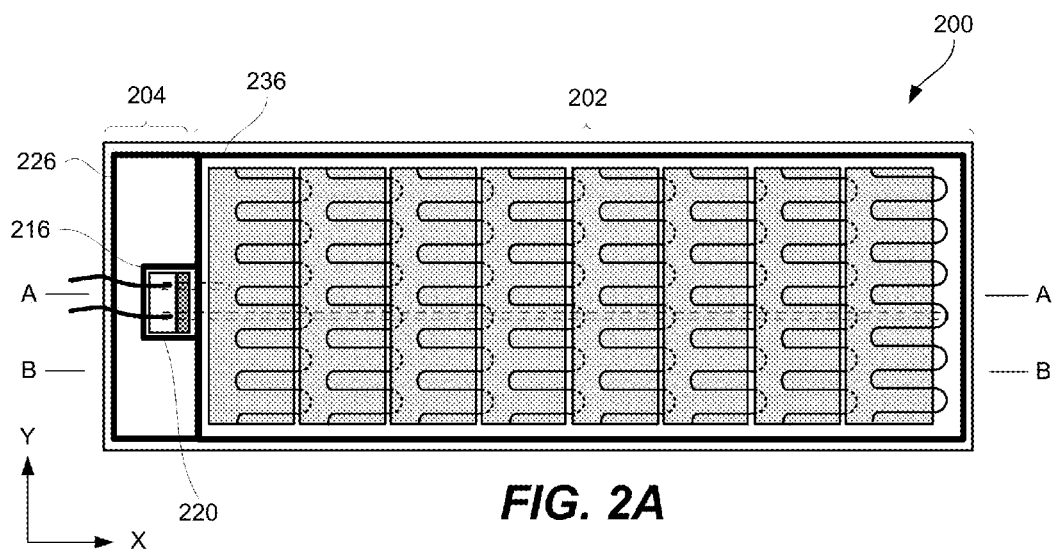
FIG. 2A
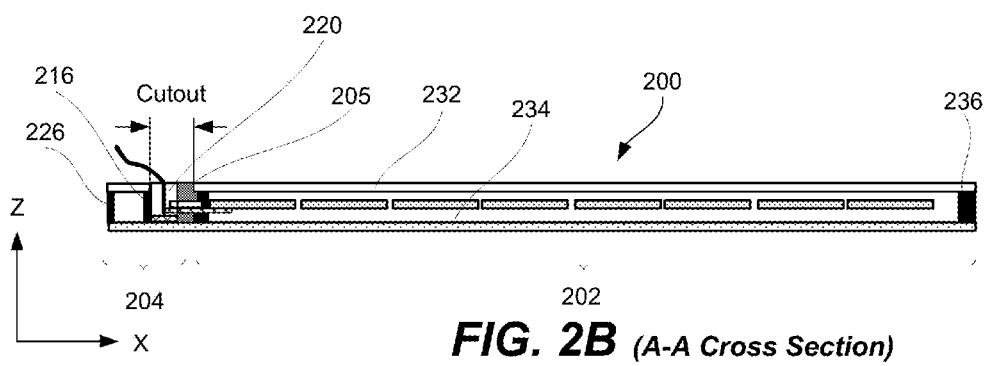
FIG. 2B (A-A Cross Section)
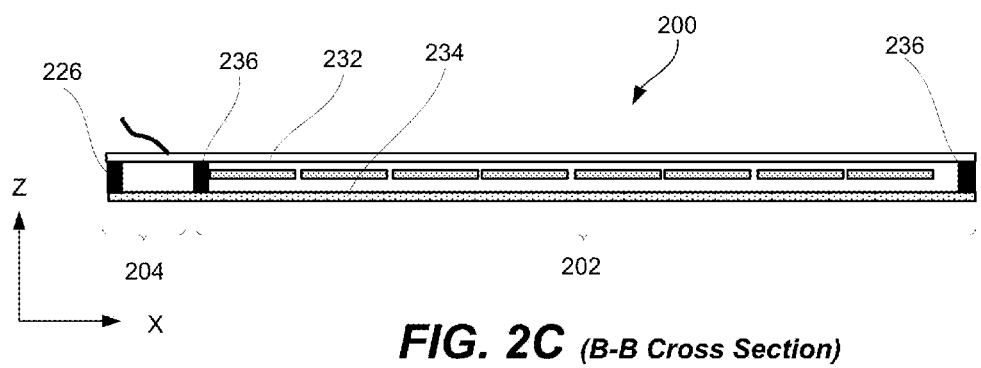
FIG. 2C (B-B Cross Section)

FLEXIBLE PHOTOVOLTAIC MODULES HAVING JUNCTION BOX SUPPORTING FLAPS

CROSS-REFERENCE TO RELATED APPLICATION

This application claims the benefit of priority to U.S. Provisional Application No. 61/811,461, titled "FLEXIBLE PHOTOVOLTAIC MODULES HAVING JUNCTION BOX SUPPORTING FLAPS," filed Apr. 12, 2013, all of which is incorporated herein by reference in its entirety and for all purposes.

BACKGROUND

Photovoltaic technology is being rapidly adopted to generate electricity from solar energy, both for local uses and for supplying power to electrical grids. Photovoltaic systems may be implemented on vehicles, buildings, or as standalone photovoltaic arrays. Photovoltaic cells are the basic units of such systems. One or more photovoltaic cells are typically arranged into a photovoltaic module, which may be then used to form a photovoltaic array.

SUMMARY

Provided are flexible photovoltaic modules having flaps for supporting junction boxes. Junction boxes are used for making electrical connections to photovoltaic cells sealed inside the modules. A flap may be formed by one or two flexible sealing sheets extending beyond the boundary of the photovoltaic cells. A junction box is attached to the front surface of the flap. In certain embodiments, a flap is formed by one sealing sheet, such as a back side sheet. Materials of the back side sheet may be different from materials of the front side sheet and can support to the junction box. Additional support to the junction box may be provided by extending one of its edges in between the two sealing sheets. This edge extension or other features may be used for mechanical protection of electrical leads extending between the junction box and photovoltaic cells.

These and other embodiments are described further below with reference to the figures.

BRIEF DESCRIPTION OF THE DRAWINGS

FIG. 2A is a top schematic view of a flexible photovoltaic module having most of the flap formed by two sealing sheets, in accordance with certain embodiments.

FIG. 2B is a side cross-section schematic view of the flexible photovoltaic module in FIG. 2A illustrating various features of the junction box and other module components, in accordance with certain embodiments.

FIG. 2C is another side cross-section schematic view of the flexible photovoltaic module in FIG. 2A, in accordance with certain embodiments.

DETAILED DESCRIPTION OF EXAMPLE EMBODIMENTS

Figure 1A:
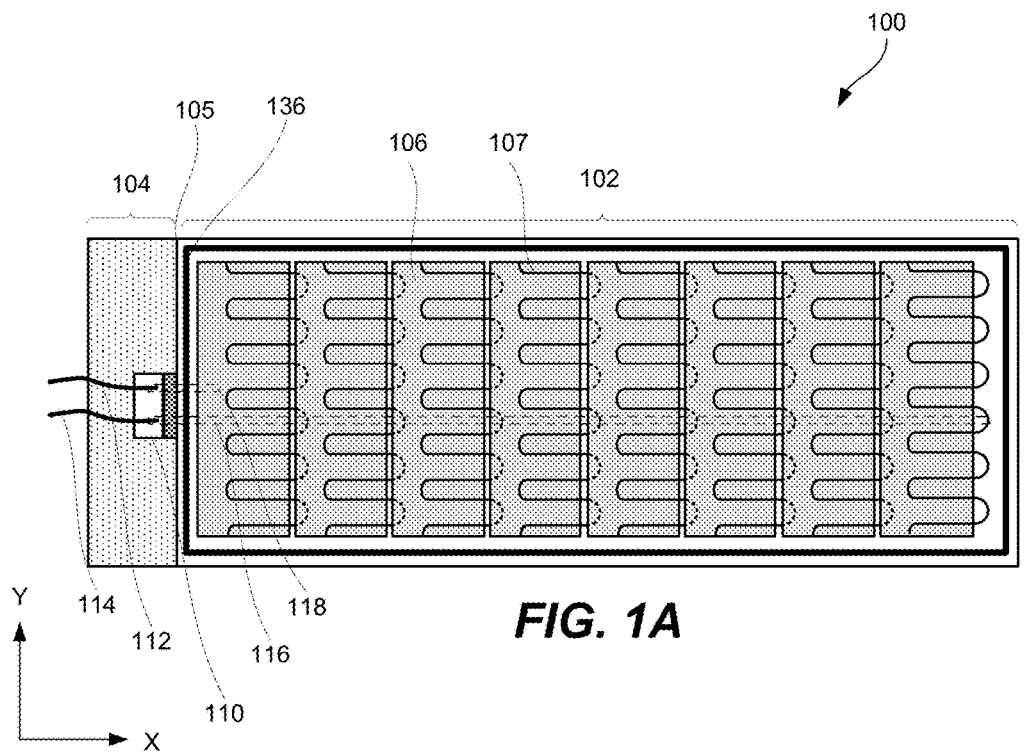
FIGS. 1A and 1B are top and side schematic views of a flexible photovoltaic module having a flap supporting a junction box, in accordance with certain embodiments.

In the following description, numerous specific details are set forth in order to provide a thorough understanding of the presented concepts. The presented concepts may be practiced without some or all of these specific details. In other instances, well known process operations have not been described in detail so as to not unnecessarily Obscure the described concepts. While some concepts will be described in conjunction with the specific embodiments, it will be understood that these embodiments are not intended to be limiting.

INTRODUCTION

Flexible photovoltaic modules are made from various flexible components, such as flexible sealing sheets and flexible photovoltaic cells. Use of these flexible components allows these modules to bend during handling and installation. These modules may be installed on surfaces that are not perfectly flat and may have some vertical surface variations. For example, flexible modules may be installed on commercial building rooftops. Such rooftops are substantially horizontal but may have some surface bumps and even small vertical steps, which are collectively referred to as topographical variations.

During installation, a flexible photovoltaic module is connected to other modules and/or various electrical components of the photovoltaic array, such as return lines, inverters, and the like. To form these connections, a flexible photovoltaic module may have one or more conductive elements accessible during installation and used for connecting to external components, such as conductive elements of adjacent modules. Some examples of these conductive elements include conductive portions of module connectors, electrical leads, wires, and other similar electrical components. For example, conductive elements may be designed to make electrical connections to standard HQRP MC4 photovoltaic connectors or some other types of external photovoltaic connectors.

One or more conductive elements of a flexible photovoltaic module may be connected to its photovoltaic cells sealed inside the module. In the same or other embodiments, one or more conductive elements may be connected to return lines provided within the module that typically extend along or across the module. The electrical connections between conductive elements and photovoltaic cells or between conductive elements and return lines may be provided by electrical leads. The electrical leads may extend from a junction box supporting the conductive elements and into the sealed space of the module. The electrical leads may extend through a sealing interface formed by bath sealing sheets and, in certain embodiments, extend through an edge seal, if one is used to form the sealing interface. Electrical leads may be in the form of thin but sufficiently conductive metal strips, which are sometimes referred to as bus bars because of their flat aspect ratios (i.e., their height being substantially smaller than their width).

In embodiments described herein electrical leads do not interfere with the sealing interface to maintain the integrity and sealing characteristics of this interface. For example, excessive stresses on the electrical leads are avoided at least at the sealing interface. Therefore, electrical leads and/or conductive elements are adequately supported to prevent stresses generated during installation and operation of the module from being transferred to the sealing interface. In some embodiments, a junction box may be used for this mechanical support. A junction box can be made from rigid insulating materials and rigidly attached to other components of the module, such as its sealing sheets. Furthermore, the junction box may support one or more conductive elements and make electrical connections to these conductive elements. In certain embodiments, a junction box is provided outside of the sealed space. In the same or other embodiments, a junction box is positioned adjacent to the sealing interface and may even overlap and/or protect this interface.

According to various embodiments, a flexible photovoltaic module includes a flap configured to support a junction box. In certain embodiments, a flap includes only one flexible sealing sheet. For example, a flap may be formed by extending a back side flexible sealing sheet beyond an edge formed by the front sealing sheet. In other embodiments, a flap includes both sealing sheets. For example, a front sealing sheet may have a cutout that allows attaching the junction box to the front surface of the back sealing sheet. Materials of the back sealing sheet may be configured to ensure bonding to the junction box and support to the junction box. Specifically, a front facing surface of the back side sealing sheet may include at least one material configured for attaching to adhesives and other similar bonding components. In a specific example, the front facing surface of the back side sealing sheet includes a non-fluorinated polymer. Unlike fluorinated polymers, non-fluorinated polymers are capable of binding with a variety of adhesives.

In certain embodiments, a multi-layered flap is formed by one of the flexible sealing sheets and one or more additional sheets. These one or more additional sheets are attached to a portion of the flexible sealing sheet extending past the edge separating the flap and sealed portion of the module. For example, a portion of the back sealing sheet may extend beyond the front sheet edge. One or more additional sheets may be positioned on the front facing surface of this portion of the back sealing sheet. In another example, a portion of the front sealing sheet extends past the back sheet edge. One or more additional sheets may be positioned on the front facing surface of this portion of the front sealing sheet, making this surface suitable for supporting a junction box.

Additional sheets attached to portions of one of the flexible sealing sheets may provide environmental protection, mechanical strength, and/or a surface suitable for attaching a junction box. For example, a composite flap may be substantially stiffer than the back side flexible sealing sheet by itself. One or more additional sheets may provide a new front facing surface that is more compatible with adhesives used for attaching a junction box. For example, a functionalized surface may be used to provide good adhesion of the junction box.

A back side flexible sealing sheet may be made from different materials than the front side sealing sheet. For example, materials more compatible for bonding with supporting surfaces (such as rooftop membranes) may be used for back side sealing sheets. In the same or other embodiments, materials more compatible for supporting adhesives and junction boxes are used for back side sealing sheets. Some examples of materials suitable for back side sealing sheets include polypropylene, including polypropylene having a high filler content, ethylene propylene diene monomer, and santoprene. Some of these materials are less expensive than materials typically used for front side flexible sealing sheets, such as fluorinated polymers, and may be more suitable for bonding to junction boxes.

Flexible Photovoltaic Module Examples

Figure 1B:
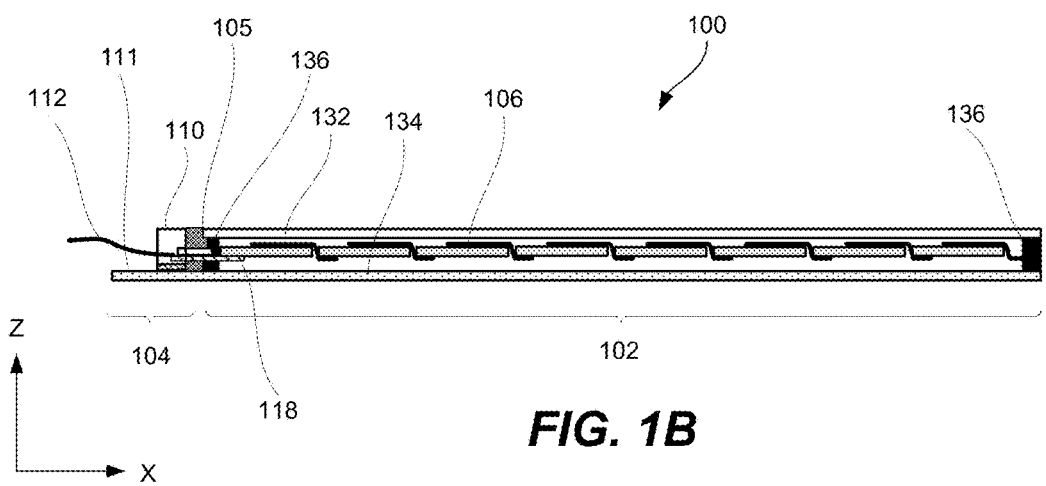

To provide some context to various flap and junction box features described in this document, various examples of flexible photovoltaic modules are first described. FIGS. 1A and 1B are top and side schematic views of flexible photovoltaic module 100 having flap 104 supporting junction box 110, in accordance with certain embodiments. Flexible photovoltaic module 100 also includes one or more photovoltaic cells 106. Photovoltaic cells 106 are provided in sealed space 102 formed by front side flexible sealing sheet 132 and back side flexible sealing sheet 134. An interface between sealed space 102 and flap 104 is referred to as sealing interface. In certain embodiments, the sealing interface coincides with an edge of one or both sealing sheets. In other embodiments, both sealing sheets protrude past the sealing interface, and the sealing interface may coincide with an edge seal, for example. That edge seal can define the boundary of the sealed space. In these latter embodiments, the flap can be formed at least in part by both sealing sheets.

The boundary of sealed space 102 may be defined by an overlap of front side flexible sealing sheet 132 and back side flexible sealing sheet 134. For example, FIG. 1B illustrates front side flexible sealing sheet 132 being shorter (in the X direction) than back side flexible sealing sheet 134. In this example, front side flexible sealing sheet 132 forms edge 105. At the same time, back side flexible sealing sheet 134 extends past this edge 105. In this example, the boundary of sealed space 102 may coincide with front side flexible sealing sheet 132 if front side flexible sealing sheet 132 is sealed along its edges with respect to back side flexible sealing sheet 134. In certain embodiments, the boundary of sealed space 102 is defined by location of edge seal 136.

Flap 104 extends outside of sealed space 102 and may be attached to or monolithic with one or both sealing sheets. In certain embodiments, the orientation of flap 104 is defined with respect to front sheet edge 105. Specifically, FIGS. 1A and 1B illustrate flap 104 extending outside of sealed space 102 on the opposite side of front sheet edge 105 with respect to sealed space 102. In certain embodiments, flap 104 is monolithic with one or both sealing sheets. As shown in FIG. 1B, back side flexible sealing sheet 134 extends past front sheet edge 105 to form flap 104. In this illustrated embodiment, the portion of back side flexible sealing sheet 134 extending past edge 105 forms the entire flap 102. In other embodiments, a flap may be formed by a combination of the two sealing sheets, by a combination of one sealing sheet and one or more additional sheets, or by combination of the two sealing sheets and one or more additional sheets. For purposes of these documents, an additional sheet is defined as a sheet that is not monolithic with either front side flexible sealing sheet 132 or back side flexible sealing sheet 134. An additional sheet may be made from the same or different materials than either one of the two sealing sheets. In yet other embodiments, a flap may be formed by one or more additional sheets without any portions of the two sealing sheets extending into the flap area. For example, an additional sheet may be attached to a back side flexible sealing sheet, to a front side flexible sealing sheet, or both. This additional sheet may extend beyond the two sealing sheets and form a flap that supports a junction box.

Flap 104 supports junction box 110. In certain embodiments, junction box 110 is attached to front facing surface 111 of flap 104. For simplicity, front facing surfaces or light incident surfaces are referred to as front surfaces. Additional support to junction box 110 may be provided by other module components that are not part of flap 104. For example, junction box 110 may be additionally attached to front side flexible sealing sheet 132 with adhesives or sealants. In the same or other embodiments, junction box 110 may be additionally supported by extending a portion of junction box 110 in between the front and back side flexible sealing sheets. For example, a tapered edge of the junction box may extend in between the sealing sheets. Furthermore, junction box 110 may be additionally supported by extending a portion of the junction box 110 over the front surface of front side flexible sealing sheet 132.

Junction box 110 is supported with respect to flap 104 or, more specifically, with respect to edge 105 to minimize the stress exerted by leads 116 and 118 on the sealing interface. FIG. 1A illustrates electrical leads 116 and 118 protruding from sealed space 102 and into junction box 110 along the X direction. Junction box 110 may at least partially enclose and support leads 116 and 118. Furthermore, junction box 110 may facilitate attachment of electrical leads 116 and 118 to conductive elements 112 and 114. To avoid interference between leads 116 and 118 and the sealing interface, junction box 110 is fixed with respect to this interface. Another reference point for attachment of junction box may be edge 105, which, in certain embodiments, define the sealing interface.

Junction box 110 may include one or more rigid materials, such as polyethylene terephthalate (e.g., RYNITE® available from Du Pont in Wilmington, Del.), polybutylene terephthalate (e.g., CRASTIN® also available from Du Pont), nylon in any of its engineered formulations of Nylon 6 and Nylon 66, polyphenylene sulfide (e.g., RYTON® available from Chevron Phillips in The Woodlands, Tex.), polyamide (e.g., ZYTEL® available from DuPont), polycarbonate (PC), polyester (PE), polypropylene (PP), and polyvinyl chloride (PVC) and weatherable engineering thermoplastics such as polyphenylene oxide (PPO), polymethylmethacrylate (PMMA), polyphenylene (PPE), styrene-acrylonitrile (SAN), polystyrene (PS) and blends based on those materials. Furthermore, weatherable thermosetting polymers, such as unsaturated polyester (UP) and epoxy, may be used. Other examples include engineered polymers that are specifically formulated to meet requirements specific for photovoltaic applications. For example, certain hybrid block co-polymers may be used. These materials meet specific requirements of photovoltaic applications, such as temperature variation stability, moisture stability, ultra violet (UV) stability, and the like. In specific embodiments, a junction box is made from one or more of the following polymers: polyethylene terephthalate, polybutylene terephthalate, nylon, polyphenylene sulfide, and polyamide.

Figure 5A:
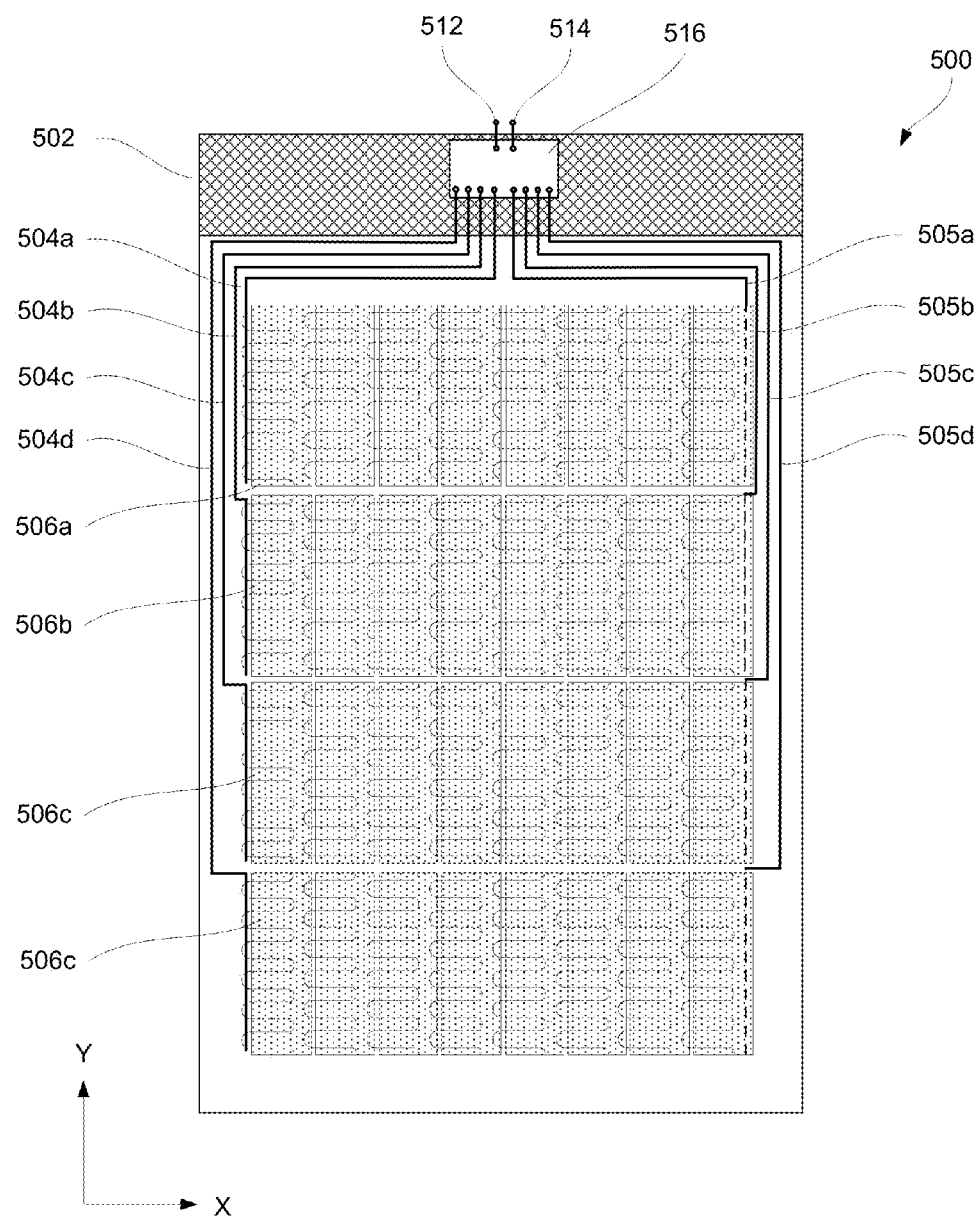
FIG. 5A is a top schematic view of a flexible photovoltaic module having a junction box for interconnecting multiple electrical leads of the module with conductive elements, in accordance with certain embodiments.
Figure 5B:
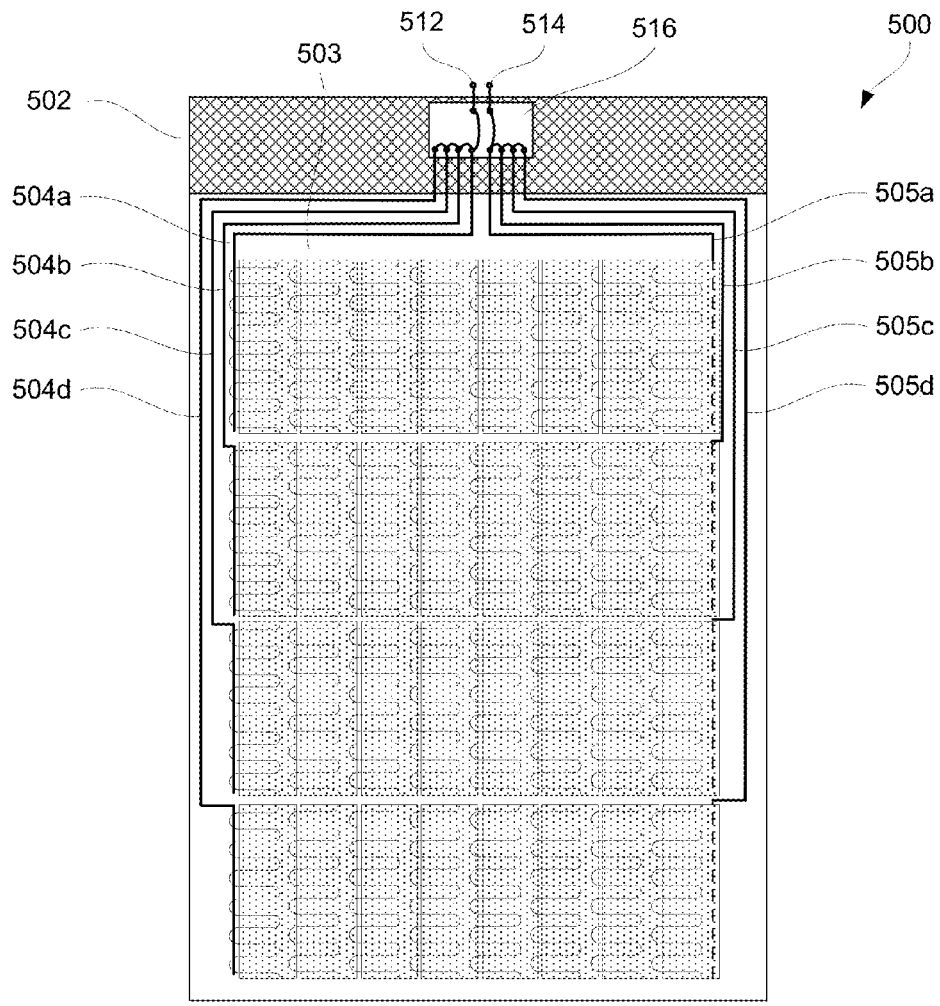
FIG. 5B is a top schematic view of the flexible photovoltaic module with interconnected electrical leads and conductive elements, in accordance with certain embodiments.
Figure 5C:
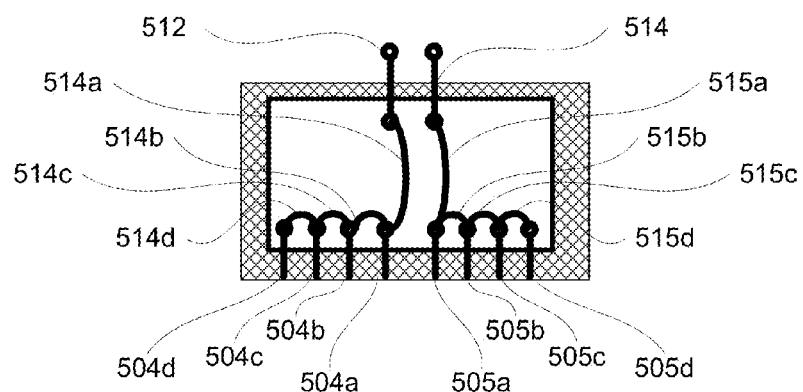
FIG. 5C is an expanded view of the junction box from FIG. 5B illustrating electrical connections made between electrical leads and conductive elements of the flexible photovoltaic module, in accordance with certain embodiments.

An electrical lead extending into a junction box may be connected to a conductive element supported by the junction box. FIG. 1A illustrates electrical lead 116 being connected to conductive element 114 and, separately, electrical lead 118 being connected to conductive element 112. Conductive elements 112 and 114 are configured for making external electrical connections, for example, to similar conductive elements of another module, juniper connector, inverter, and the like. Any number of leads and conductive elements may be provided in the same junction box. For examples, FIGS. 5A-5C illustrate eight electrical leads protruding into a junction box and two conductive elements provided in that box. Each electrical lead may be connected to a separate conductive element as shown in FIG. 1A. In other embodiments, one electrical lead may be connected to multiple conductive elements. In the same or other embodiments, one conductive element may be connected to multiple electrical leads in the junction box as further described below with reference to FIGS. 5A-5C. These connections may be provided in the junction box during fabrication of the photovoltaic module or provided in the field.

Electrical leads extending from a junction box may be also connected to photovoltaic cells and/or return lines. FIG. 1A illustrates electrical lead 116 connected to cells 106 or, more specifically, to the back side of the left most cell in the set. Lead 118 is also shown connected to cells 116 but it is connected to interconnecting wire network 107 positioned over the front side of the right most cell in the set. As such, leads 116 and 118 may have different polarities. FIG. 1A illustrates all photovoltaic cells being interconnected and forming the same set. In certain embodiments, photovoltaic cells may be arranged into multiple sub-sets. In these embodiments, a junction box may have electrical leads connected individually to different sub-sets of photovoltaic cells as further explained below with reference to FIGS. 5A and 5B. In these embodiments, the sub-sets may be interconnected in the junction box according to different connection schemes, e.g., in parallel or in series.

In certain embodiments, a flexible photovoltaic module may have one or more return lines. A return line is not connected to any photovoltaic cells of the module. Instead both ends of return line may be connected to conductive elements provided, for example, in different junction boxes. The return line extends between these junction boxes and across or along the module. The return line may be connected directly to the conductive elements or through electrical leads, e.g., similar to connections to the photovoltaic cells explained above. In the case of different connections, the return line may extend through one or more sealing interfaces. In these embodiments, return line may be relatively wide and thin, similar to a bus bar.

Conductive elements of a junction box may be electrical wires extending from the junction box, pins, sockets, and/or various other types of conductive components for connecting to external components. In a specific embodiment, a conductive element may be a socket for receiving and connecting to another conductive element of an adjacent photovoltaic module during installation. Conductive elements may be equipped with various safety features to prevent accidental touching of conductive elements.

Photovoltaic cells 106 in module 100 are flexible photovoltaic cells. Examples of flexible photovoltaic cells include copper indium gallium selenide (CIGS) cells, cadmium-telluride (Cd—Te) cells, amorphous silicon (a-Si) cells, micro-crystalline silicon (Si) cells, crystalline silicon (c-Si) cells, gallium arsenide (GaAs) multi-junction cells, light adsorbing dye cells, organic polymer cells, and other types of photovoltaic cells. A photovoltaic typically has a photovoltaic layer that generates a voltage when exposed to light. The photovoltaic layer may be positioned adjacent to a back conductive layer, which, in certain embodiments, is a thin flexible layer of a metal such as molybdenum (Mo), niobium (Nb), copper (Cu), silver (Ag), and combinations and alloys thereof. The photovoltaic cell may also include a flexible conductive substrate, such as stainless steel foil, titanium foil, copper foil, aluminum foil, or beryllium foil. Another example includes a conductive oxide or metallic deposition over a polymer film, such as polyimide. In certain embodiments, a substrate has a thickness of between about 2 mils and 50 mils (e.g., about 10 mils), with other thicknesses also in the scope of the embodiments described herein. The photovoltaic cell may also include atop flexible conductive layer. This layer can include one or more transparent conductive oxides (TCO), such as zinc oxide, aluminum-doped zinc oxide (AZO), indium tin oxide (ITO), and gallium doped zinc oxide. A typical thickness of a top conductive layer is between about 100 nanometers and 1,000 nanometers or, more specifically, about 200 nanometers and 800 nanometers. Photovoltaic cells 106 may be interconnected, for example, by one or more wire networks 107. A wire network 107 may extend over a front side of one cell as well as over a back side of another adjacent cell to interconnect these two cells in series as shown in FIGS. 1A and 1B.

Sealing sheets 132 and 134 may include flexible materials, such as polyethylene, polyethylene terephthalate (PET), polypropylene, polybutylene, polybutylene terephthalate (PBT), PPO, polyphenylene sulfide (PPS) polystyrene, PC, ethylene-vinyl acetate (EVA), fluoropolymers (e.g., polyvinyl fluoride (PVF), polyvinylidene fluoride (PVDF), ethylene-terafluoethylene (ETFE), fluorinated ethylene-propylene (FEP), perfluoroalkoxy (PFA) and polychlorotrifluoroethane (PCTFE)), acrylics (e.g., poly(methyl methacrylate)), silicones (e.g., silicone polyesters), and/or PVC, as well as multilayer laminates and co-extrusions of these materials. A typical thickness of a sealing sheet is between about 5 mils and 100 mils or, more specifically, between about 10 mils and 50 mils, though other thicknesses may be used as well. In certain embodiments, a back side flexible sealing sheet includes a metallized layer to improve its water permeability characteristics. For example, a metal foil may be positioned in between two insulating layers to form a composite back side flexible sealing sheet.

In certain embodiments, back side flexible sealing sheet 134 is made from material that is different than a material of front side flexible sealing sheet 132. Materials for back side flexible sealing sheet 134 may be specifically selected to ensure compatibility of back side flexible sealing sheet 134 with various supporting structures to which the module is attached during later fabrication and/or installation. For example, back side flexible sealing sheet 134 may be attached to an intermediate base sheet or directly to a rooftop membrane. The attachment may be by direct welding, using adhesives, or some other attachment technique. An intermediate base sheet or a rooftop membrane may be made from various materials, such as ethylene propylene diene terpolymer (EPDM), thermoplastic olefin (TPO), PVC, styrene-butadiene-styrene (SBS) modified bitumen, atactic polypropylene (APP) modified bitumen, and polyvinyl idene fluoride (PVDF). Some of these materials may be used as layers or coatings provided over steel or aluminum sheets. In certain embodiments, back side flexible sealing sheet 134 may include at least a back surface made from EPDM, TPO, SBS, APP, and/or PVDF. In other embodiments, the entire back sealing sheet is made from one or more of these materials. Other examples of materials for fabricating back side flexible sealing sheet 134 include polypropyelene (such as polypropyelene with a high content of filler, e.g., at least about TBD % of filler by weight) and santoprene.

Materials for back side flexible sealing sheet 134 may be also selected to ensure sufficient support to junction box 110. For example, back side flexible sealing sheet 134, or at least its front side surface or, more generally, the surface facing junction box 110 may not contain fluoro-polymers. Fluoro-polymers, such as TBD, are commonly used for front sealing sheets because of their transparency characteristics and UV stability. However, fluoro-polymers are difficult to bond to. Furthermore, fluoro-polymers are often expensive than many other materials that could be used as back side sealing sheets or additional sheets that form flap 104.

In certain embodiments, a flap portion of back side flexible sealing sheet 134 may be specifically treated to improve its surface bonding properties. For example, the junction box facing surface may be functionalized by impregnation with filler particles or other materials that bond with adhesives and other like materials. In other embodiments, further described below, back side flexible sealing sheet 134 may be laminated with other sheets in the flap area to provide bonding surface and, for example, mechanical strength.

In certain embodiments, back side flexible sealing sheet 134 may be thicker than front side flexible sealing sheet 132. Additional thickness can provide support to junction box 110 in the flap area and, for example, facilitate bonding the back sealing sheet to other structures. Back side flexible sealing sheet 134 may be generally substantially thinner than rooftop membranes. In certain embodiments, the thickness of back side flexible sealing sheet 134 is less than 80 mils or, more specifically, less than 40 mils or even less than 20 mils.

In certain embodiments, flexible photovoltaic module 100 has an encapsulant layer positioned in between front side flexible sealing sheet 132 and photovoltaic cells 106. Another encapsulant layer may be provided between back side flexible sealing sheet 134 and photovoltaic cells 106. Examples of encapsulant layer materials include non-olefin thermoplastic polymers or TPO, such as polyethylene (e.g., a linear low density polyethylene), polypropylene, polybutylene, PET, PBT, polystyrene, polycarbonates, fluoropolymers, acrylics, ionomers, silicones, and combinations thereof.

Flexible photovoltaic module 100 may also include an edge seal 136 that surrounds and seals photovoltaic cells 106 together with sealing sheets 132 and 134 as well as with other components. Edge seal 136 may prevent moisture from penetrating towards cells 106. Edge seal 136 may be made from certain organic or inorganic materials that have low inherent water vapor transmission rates. In certain embodiments, edge seal 136 is configured to absorb moisture from inside the module in addition to protecting the module from moisture ingression. For example, a butyl-rubber containing moisture getter or desiccant may be added to edge seal 136. In certain embodiments, a portion of the edge seal 136 that contacts electrical components (e.g., bus bars) of module 100 is made from a thermally resistant polymeric material. Edge seal 136 may also secure front side flexible sealing sheet 132 with respect to back side flexible sealing sheet 134. In certain embodiments, edge seal 136 determines boundaries of sealed space 102. Furthermore, edge seal 136 may at least partially overlap with a portion of the junction box extending between the sealing sheets to provide additional support to the junction box as further explained below with reference to FIG. 3.

Figure 1C:
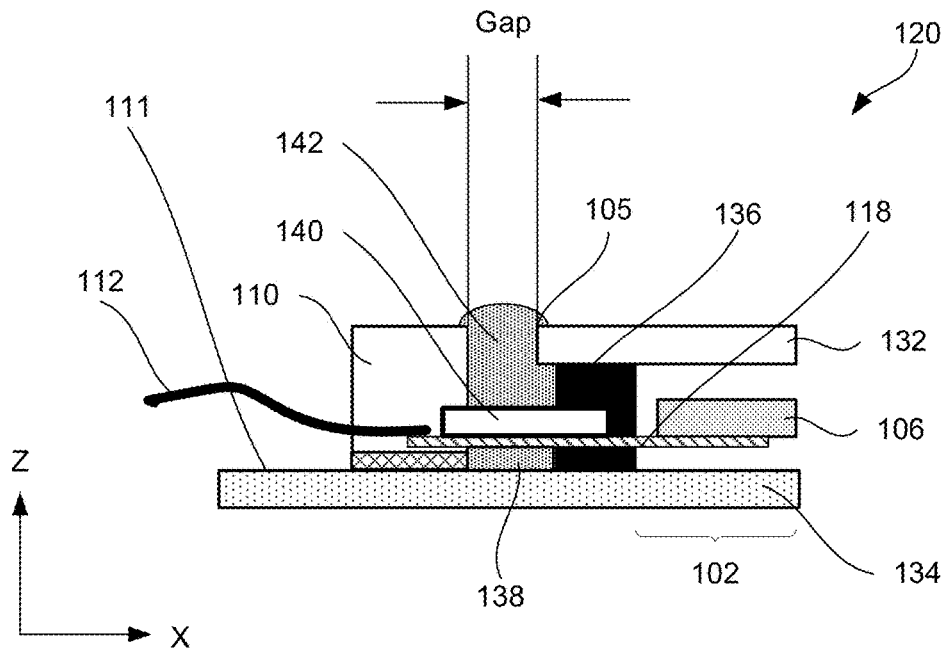
FIG. 1C is an expanded side schematic view of a module portion illustrating various features of a flap and sealed space of a flexible photovoltaic module, in accordance with certain embodiments.

A portion of the module between sealed space 102 and junction box 110 may include various features for sealing, protecting, insulating, and/or reinforcing the sealing interface and/or to support junction box. Some of these features will now be described with reference to FIG. 1C. Specifically, FIG. 1C is an expanded side schematic view of module portion 120 between sealed space 102 and junction box 110, in accordance with certain embodiments. This figure shows portions of front side flexible sealing sheet 132 and back side flexible sealing sheet 134 as well as one of photovoltaic cells 106 sealed in between these two sealing sheets. This photovoltaic cell is shown connected to conductive element 112 by electrical lead 118. Lead 118 extends through edge seal 136 and front sheet edge 105 and into junction box 110. Junction box 110 is separated from edge 105 by a certain distance (identified as "Gap" in FIG. 1C). To protect electrical lead 118 (and other leads) within this gap from accidental contact with various sharp objects, module 100 may include puncture resistant structure 140. This structure 140 is mechanically strong and can protect electrical lead 118 from being punctured by sharp objects during installation and operation of the module. Puncture resistant structure 140 may also provide environmental protection, rigidity, mechanical stability, and electrical insulation to parts of the sealing interface and lead 118.

Some examples of materials for puncture resistant structure 140 include PET, polyethylene naphthalate (PEN), poly(ETFE), ionomer resins (e.g., poly(ethylene-co-methacrylic acid)), polyamide, polyetherimide (PEI), polyetheretherketone (PEEK), and various combinations thereof. These materials may be formed into and provided as a film. Puncture resistant structure 140 may have one or more adhesive layers disposed on one or both sides of the film, such as Surlyn®, available from E. I. du Pont de Nemours and Company in Wilmington, Del. For example, a support structure may have three polymer layers, such as a co-extruded stack containing Surlyn®, PET, and another layer of Surlyn® with the PET layer positioned in between the two Surlyn® layers).

Puncture resistant structure 140 may extend above electrical lead 118 at least within the gap. In certain embodiments, a similar puncture resistant structure is positioned on the other side of lead 118, which is shown as element 138 in FIG. 1C. Puncture resistant structure 138 may attach lead 118 to and/or support lead 118 with respect to back side flexible sealing sheet 134. One or both puncture resistant structures 138, 140 may extend into junction box 110 and/or in between front side flexible sealing sheet 132 and back side flexible sealing sheet 132, thereby providing rigidity to module portion 120.

FIG. 1C also illustrates sealant 142 provided in the gap between junction box 110 and front sheet edge 105. Sealant 142 may extend over the front surfaces of junction box 110 and front side flexible sealing sheet 132 as shown in the figure. Sealant 142 may prevent water from collecting in the gap and interfering with the performance of the module. For example, if water is collected in the gap, freezing and thawing cycles may stress the sealing interface and potentially compromise the seal and performance of the module.

Examples of sealant 142 include silicone based PV 804 Neutral Sealant available from Dow Corning in Midland, Mich. Other examples include ionomers, acrylates, acid modified polyolefins, anhydride modified polyolefins, polyimides, polyamides, and various cross-linkable thermoplastics. More specific examples include BYNEL® resins supplied by DuPont in Wilmington, Del. For example, the following may be used: Series 1100 acid-modified ethylene vinyl acetate (EVA) resins, Series 2000 acid-modified ethylene acrylate polymers, Series 2100 anhydride-modified ethylene acrylate copolymers, Series 3000 anhydride-modified EVA copolymers, Series 3100 acid- and acrylate-modified EVA resins (which provide a higher degree of bond strength that Series 1100 resins), Series 3800 anhydride-modified EVA copolymers (with a higher level of vinyl acetate in the EVA component than the 3000 and 3900 series), Series 3900 anhydride-modified EVA resins (with an improved level of bonding to polyamides and EVOH), Series 4000 anhydride-modified high density polyethylene resins (HDPE) resins, Series 4100 anhydride-modified linear low density polyethylene (LLDPE) resins, Series 4200 anhydride-modified low density polyethylene (LDPE) resins, and Series 5000 anhydride-modified polypropylene (PP) resins. Another specific example is JET-MELT® Polyolefin Bonding Adhesive 3731 supplied by 3M Engineered Adhesives Division in St. Paul, Minn. Some of these resins can be mixed with other resins or fillers, such as polypropylene and polystyrene resins, as well as various ionomers, to adjust their thermal stability, viscosity of the molten state during fabrication, and adhesion properties.

In certain embodiments, a material 146 can be disposed between junction box 110 and back side flexible sealing sheet 134. Material 146 can include one or more of the adhesives described above. The puncture proof structure 138 disposed between lead 118 and back side sealing sheet can also include such an adhesive.

Flap Examples

Figure 1D:
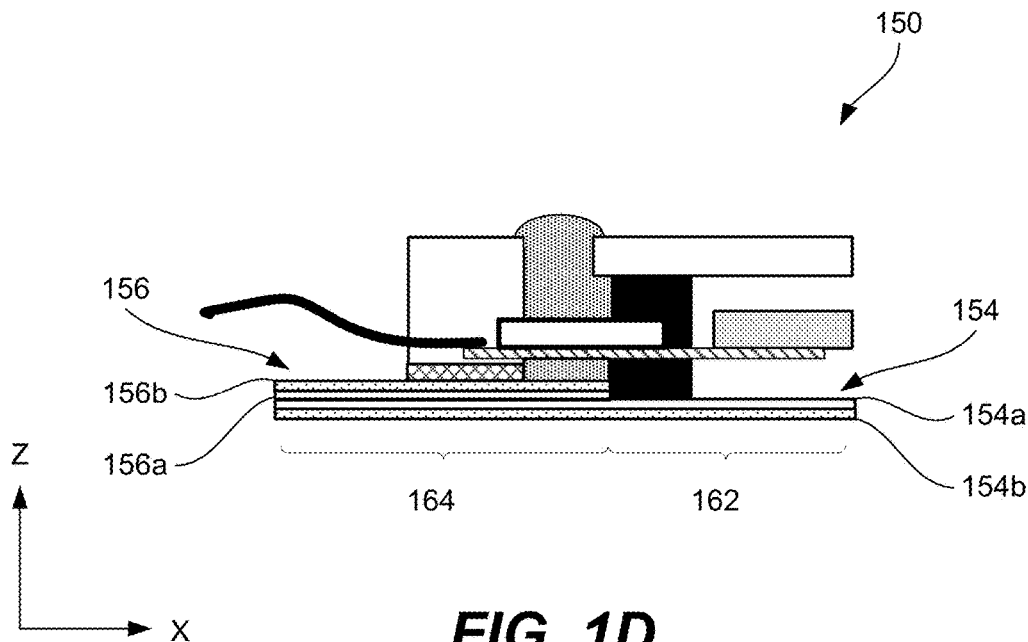
FIG. 1D is an expanded side schematic view of a module portion illustrating various features of a multilayered flap and sealed space of a flexible photovoltaic module, in accordance with certain embodiments.

Flaps that support junction boxes may be formed by extending one or more sealing sheets outside of the sealed areas. These extended flap portions of the sealing sheets may be reinforced or otherwise modified by additional sheets. FIG. 1D illustrates a portion of flexible photovoltaic module 150 having multilayered flap 164, in accordance with certain embodiments. Multilayered flap 164 may be formed by two or more sheets, such as extending back side flexible sealing sheet 154 outside of sealed space 162 and positioning another sheet 156 over this extension as shown in FIG. 1D. Each layer in a multilayered flap may correspond to a separate sheet. In certain embodiments, one or more sheets forming a multilayered flap may have multilayered structure as further explained below with reference to elements 154*a*, 154*b*, 156*a* and 156*b*.

Returning to FIG. 1D, sheet 156 may be referred to as a top layer of multilayered flap 164. Sheet 156 may extend over the entire surface of multilayered flap 164 or just a portion of this surface. In certain embodiments (not shown), a top layer may extend from the front sheet edge and under the junction box but not to the edge of the flap. In other embodiments (not shown), the entire flap (multilayered or single-layered) may end at the junction box such that the junction box may be positioned at the edge of the flap.

Back side flexible sealing sheet 154 may itself be a multilayered structure and may include first layer 154*a* and second layer 154*b*. In certain embodiments, a similar multilayered sheet may be used as a top portion in the flap area. As shown in FIG. 1D, additional sheet 156 includes first layer 156*a* and second layer 156*b*. In certain embodiments, first layer 156a of additional sheet 156 is the same as first layer 154a of back side flexible sealing sheet 154, while second layer 156b of additional sheet 156 is the same as second layer 154b of back side flexible sealing sheet 154. In these embodiments, multilayered flap 164 may be formed by positioning first layer 156a of additional sheet 156 over first layer 154a of back side flexible sealing sheet 154 (as shown) or by positioning second layer 156b of additional sheet 156 over second layer 154b of back side flexible sealing sheet 154 (not shown). Use of the same material in adjacent layers may help to provider stronger bonds. Sheets 154 and 156 may be laminated to each other to provide bonding between layers 154a and 156a.

In certain embodiments, a flap is formed by both the front and back side flexible sealing sheets. FIGS. 2A-2C are top and two cross-sectional side schematic views of flexible photovoltaic module 200 having flap 204 formed by front side flexible sealing sheet 232 and back side flexible sealing sheet 234, in accordance with certain embodiments. In these embodiments, boundaries of two sealing sheets 232 and 234 may coincide and include flap 204 as well as sealed space 202. In some embodiments, the interface between flap 204 and sealed space 202 may not have an edge extending across the entire width of module 200. Instead, the interface may be defined by edge seal 236. In certain embodiments, edge seal 236 may be also provided within the boundaries of flap 204 to seal the space between two sheets 232 and 234 in this area as well. Edge seal 236 may be also provided around the opening made in front side flexible sealing sheet 232 as shown in FIG. 2A.

To better illustrate various details of the module around the junction box, two cross-sectional views of flexible photovoltaic module 200 are provided. FIG. 2B is a cross-sectional side schematic view of flexible photovoltaic module 200 that includes junction box 220 and corresponds to the cross-section plane A-A identified in FIG. 2A, in accordance with certain embodiments. Junction box 220 is positioned within the cutout made in front side flexible sealing sheet 232. The cutout defines edge 205 of front side flexible sealing sheet 232, which may be used for referencing the position of junction box 220. The cutout may or may not extend to any outside edges of front side flexible sealing sheet 232; in the embodiment shown in FIG. 2A, it does not extend to any outside edges. The cutout allows for attaching junction box 220 to front side flexible sealing sheet 232, similar to the embodiments described above. The interface between junction box 220 and inside edges of front side flexible sealing sheet 232 may be sealed with various sealing materials described above.

FIG. 2C is another cross-sectional side schematic view of flexible photovoltaic module 200 that does not include junction box 220 in its cross-section plane B-B, also identified in FIG. 2A, in accordance with certain embodiments. FIG. 2C is presented to illustrate various differences in the two cross-sectional schematic views. As shown in this figure, sealing sheets 232 and 234 extend between opposites edges of module 200 in the X direction.

In certain embodiments, the front light-incident surface of a flap may have a light reflecting material or color. This feature may reduce unwanted heating of the module in this area and protect, to a certain extent, the sealing interface adjacent to the flap. For example, a front side of the flap may have white, silver, or some other light color. In certain embodiments, the color of the front side of the flap may match the color of the rooftop membrane.

Junction Box Examples

A junction box may be used to make one or more electrical connections to electrical leads extending from the sealed space. For example, these leads may be interconnected with various conductive elements provided in the junction box. Other functions of a junction box may include protecting and insulating the electrical leads as they extend out of the sealed space, reinforcing the interface between the sealing sheets and junction box, and housing connectors and various electrical and electronic components. Overlapping a portion of the junction box with at least the front side flexible sealing sheet may provide protection and insulation for the electrical leads as they extend out of the sealed space. This portion may extend in between the sealing sheets as shown in FIG. 3 or over the front sealing sheet as shown in FIG. 4.

Figure 3:
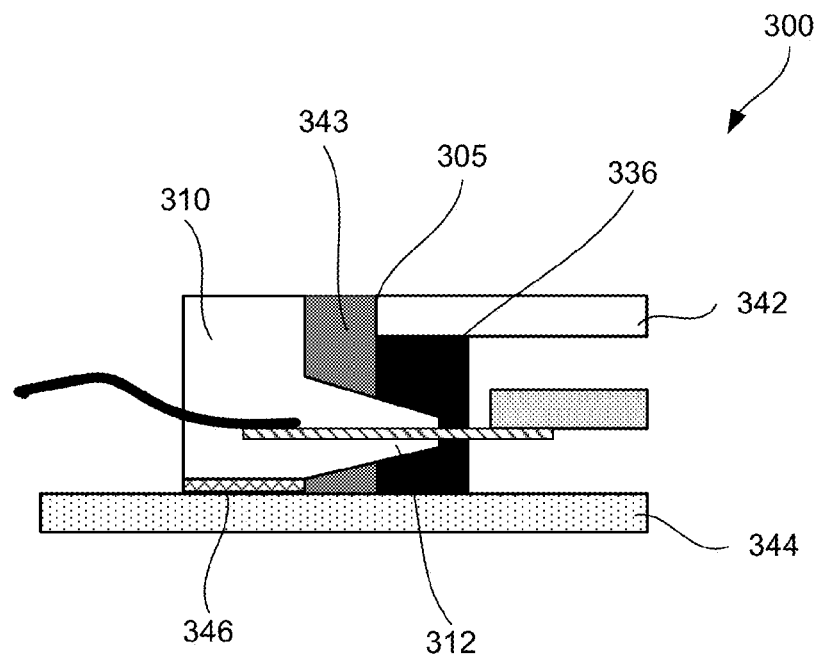
FIG. 3 is an expanded side schematic view of a module portion illustrating various features of a flap and tapered edge of a junction box extending in between sealing sheets, in accordance with certain embodiments.

Specifically, FIG. 3 illustrates a portion of flexible photovoltaic module 300 having junction box 310 with tapered edge 312 extending between back side flexible sealing sheet 344 and front side flexible sealing sheet 342, in accordance with certain embodiments. Tapered edge 312 may also overlap with edge seal 336. Tapered edge 312 may protrude through seal 336 (not shown) or its tip may be buried in the edge seal 336, as shown in FIG. 3. This overlap between edge seal 336 and tapered edge 312 may support junction box 310, in addition to other supporting features. Any gap between junction box 310 and edge 305 may be filled with sealant 343, which may also provide some support to junction box 310 with respect to edge 305. In certain embodiments, adhesive material 346 attaches a portion of junction box 310 to back side flexible sealing sheet 344. Various shapes of an edge extending in between the two sealing sheets may be used.

Figure 4:
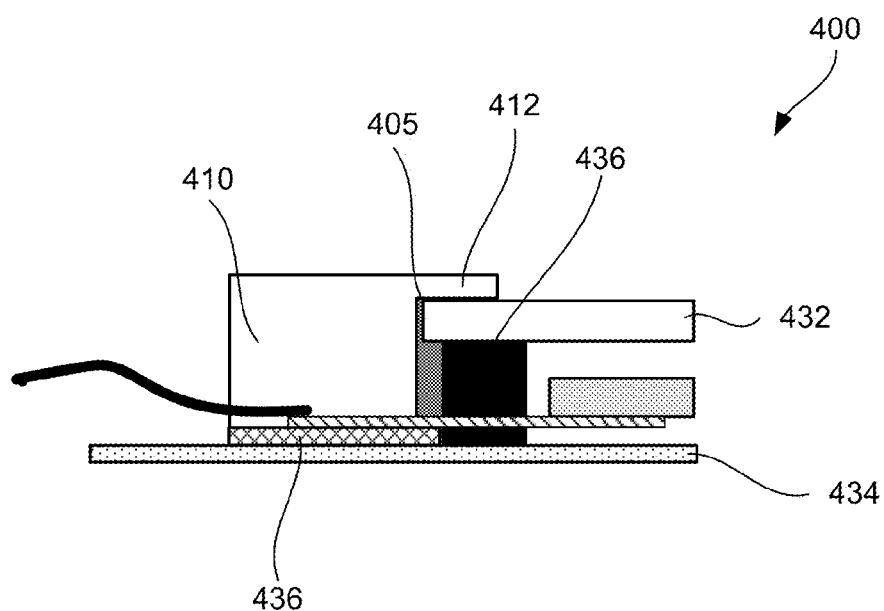
FIG. 4 is an expanded side schematic view of a module portion illustrating various features of a flap and portion of a junction box extending over a front side sealing sheet, in accordance with certain embodiments.

FIG. 4 illustrates a portion of flexible photovoltaic module 400 having junction box 410 extending over edge 405 of front side flexible sealing sheet 432, in accordance with certain embodiments. Specifically, junction box 410 has extension 412 extending over the front surface of sealing sheet 432. In certain embodiments, extension 412 may be bonded or sealed to the front surface of sealing sheet 432. Junction box 410 may be also attached to back side flexible sealing sheet 434 using, for example, a patch of adhesive 436.

Junction boxes and their extending portions described above may be made from rigid insulating materials, various examples of which are listed above. As such, the electrical leads may be adequately protected by these extending portions, with no separate puncture resistant structures used at this interface. Furthermore, the rigidity of the extensions and their overlap and, in certain embodiments, bonding to one or both sealing sheets, may stiffen the interface and reduce the stresses that electrical leads may exert on the sealing interface.

Attachment of Flexible Photovoltaic Modules to Rooftop Membranes

Flexible photovoltaic modules may be used on rooftops of various buildings that are protected from the environment by rooftop membranes. The modules may be secured directly to such membranes without a need for specific mounting hardware. In certain embodiments, intermediate base sheets may be used to integrate multiple modules into the same assembly and to provide additional protection to the building after installation of the module. Attachments between back side flexible sealing sheets, rooftop membrane sheets, and intermediate base sheets, if used, may be performed by the welding of two or more sheets that are made compatible materials, by applying an adhesive in between adjacent sheets, and other similar methods.

In certain embodiments, a flexible photovoltaic module may include an adhesive positioned on the back side flexible sealing sheet or, more specifically, on the back surface (i.e., the external side with respect to the photovoltaic cells) of the back side flexible sealing sheet. This adhesive may be used during installation to attach modules to a rooftop membrane or some intermediate structure. Some examples of adhesives include hot mop asphalt, pine tar pitches, ethylene vinyl acetate, polyurethane (e.g., moisture cured silinated polyurethane, silicone epoxy, styrene-isoprene-styrene, styrene-butadiene-styrenes, ethylene ethyl acrylates, butyl or halobutyl rubbers, acrylics, ethylene propylene rubbers, ethylene propylene diene monomers rubbers, styrene/butadiene rubbers, and styrene-ethylene-butene-styrene copolymers. A specific example includes a pressure sensitive hot melt adhesive PSA-3 Hot Melt Adhesive, available from ADCO Products, Inc. in Michigan Center, Mich. Some of these materials may become tacky when exposed to the higher temperature occurring during installation to form bonds with roofing membranes and other materials. To protect an adhesive during handling, a release liner may be provided over the adhesive.

In certain embodiments, a flexible photovoltaic module includes a base sheet attached to the back side of the back side flexible sealing sheet. The base sheet may extend outside of the boundaries of the back side flexible sealing sheet to form extensions. These extensions may be used to attach the module to a roofing membrane. For example, extensions may be glued or welded to the roofing membrane.

A base sheet may be made from one or more materials compatible or similar to materials of the rooftop membrane. Examples include EPDM, TPO, PVC, SBS, APP, and PVDF. The thickness of the base sheet is generally greater relative to the thickness of the back side flexible sealing sheet. In certain embodiments, the thickness of the base sheet is substantially the same as the thickness of the roofing membrane. Specifically, the thickness may be at least about 40 mils or, more specifically, at least about 80 mils.

A base sheet may provide additional protection to the roofing structure positioned on the other side of the roofing membrane. Specifically, the roofing membrane may operate at temperatures of less than 50° C.-60° C. Installing a flexible photovoltaic module made from generally light absorbing materials may raise this operating temperature substantially. The multilayered protection provided by a combination of the roofing membrane and base sheet may allow the entire assembly to operate at much high temperature without comprising the overall seal.

Furthermore, a base sheet may allow removing the photovoltaic membrane from the rooftop. The base sheet may have flaps extending beyond the photovoltaic modules. The width of such flaps may be at least about 1 inch or, more specifically, at least about 2 inches, or even at least about 5 inches. These flaps may be used for attaching the entire assembly to the rooftop. To remove the assembly, a flap may be cut in between the module and attachment location. The remaining flap may be later used for attaching to another rooftop.

In certain embodiments, one base sheet may include multiple flexible photovoltaic modules attached to the sheet prior to installation of this assembly onto the rooftop. The number of modules on one sheet depends on the size of the individual modules. It is generally desirable to limit the overall size of the assembly to one that can be handled by one or two installers. For example, two flexible modules that are each 1.5 meter long and 1.0 meter wide may be provided in the same base sheet.

Electrical Safety and Configuration Features

When photovoltaic cells of a module are exposed to light, these cells may apply voltage to various conductive components of the module. This may occur prior to or during installation of the module. If conductive elements of a module are connected to the cells, it may present some safety concerns. To address these concerns, conductive elements may be enclosed in insulating bodies that prevent accidental contact but still allow for establishing electrical connections with other conductive elements. However, such insulating bodies may result in very thick junction boxes (in the Z direction as shown in FIG. 1B). Excessive thickness of the connector bodies may cause tripping hazards when rooftops are used as walkways and/or difficulties with sealing adjacent modules.

In certain embodiments, one or more conductive elements of a flexible photovoltaic module are disconnected from the photovoltaic cells of this module prior to installation and during initial installation operations (e.g., until conductive elements are connected to other electrical components and cannot be reached by installers). At some point during installation, these conductive elements are connected to the photovoltaic cells to provide a fully operational module. These later connections may be established in the junction box, which may be accessible after the module is physically installed on the roof top (e.g., accessible from the front side of the module), and/or by providing an electronic control unit that may activate this connection after receiving some signal. In certain embodiments, the electronic control unit may be provided in the junction box.

FIG. 5A is a schematic view of flexible photovoltaic module 500 including junction box 516 supported by flap 502, in accordance with certain embodiments. Electrical leads 504a-504d and 505a-505d are connected to respective photovoltaic cells 506a-505d but are disconnected from conductive elements 512 and 514 in the state shown in FIG. 5A.

Specifically, flexible photovoltaic module 500 includes four sets of photovoltaic cells 506a-506d with each having a pair of electrical leads (i.e., set 506a has electrical leads 504a and 505a, set 506b has electrical leads 504b and 505b, set 506c has electrical leads 504c and 505c, and set 506d has electrical leads 504d and 505d). Electrical leads 504a-504d have a different polarity with respect to electrical leads 505a-505d. Photovoltaic cells are interconnected in series in each set. One having ordinary skill in the art would understand that other cell arrangements with flexible modules are possible. For example, photovoltaic cells may be interconnected in parallel in each other.

Flexible photovoltaic module 500 may be manufactured in the state shown in FIG. 5A. Further, module 500 may be kept in that state until installation and even during some initial installation operations. As such, even if the photovoltaic cells of sets 506a-506d are exposed to light during handling and installation of photovoltaic module 500, the voltage will not be applied to conductive elements 512 and 514. In certain embodiments, photovoltaic cell electrical leads 504a-504d and 505a-505d are interconnected with each other during manufacturing but are still disconnected from conductive elements 512 and 514.

FIG. 5B is a schematic view of flexible photovoltaic module 500 with electrical leads 504a-504d and 505a-505d connected to conductive elements 512 and 514, in accordance with certain embodiments. Junction box 516 may be accessed to install various bridging connectors, which will now be explained with reference to FIG. 5C, which illustrates an expanded view of junction box 516 after connections have been completed. Electrical leads 504*a*-504*d* are interconnected with bridging connectors 514*b*-514*d*. Electrical leads 505*a*-505*d* are separately interconnected with bridging connectors 515*b*-515*d*. In this embodiment, photovoltaic cell sets 506*a*-506*d* are interconnected in series. However, other connection schemes are possible as well. Interconnected electrical leads 504*a*-504*d* are also connected to conductive element 512 using bridging connector 514*a*. In a similar manner, interconnected electrical leads 505*a*-505*d* are connected to conductive element 514 using bridging connector 515*a*.

In certain embodiments, multiple bridging connectors are integrated into a single physical component, which, for example, may be plugged into a socket provided in the junction box during one of the installation operations. In certain embodiments, one or more bridging connectors may be provided in junction box 516 during module fabrication. However, these bridging connectors do not make electrical connections between electrical leads 504*a*-504*d* and conductive element 512 or between electrical leads 505*a*-505*d* and conductive element 514. During installation, these bridging connectors are reoriented to provide necessary connections.

Prior to forming the electrical connections shown in FIGS. 5B and 5C, conductive elements 512 and 514 may be connected to other conductive elements, such as conductive elements of another module or conductive elements of a jumper connector. For purposes of this document, a jumper connector is defined as a component that electrically interconnects two or more conductive elements of the same junction box. For example, multiple flexible photovoltaic modules may be interconnected in series, forming a string of interconnected modules. Two modules in this string represent end modules and are connected to only one other module in the string. All other modules are connected to two other (e.g., adjacent) modules in the string. One end module may be connected to an inverter or some other electrical component of the array. Another end module may have its return line interconnected with photovoltaic cells at its end that is not connected to another module. Sometimes this interconnection is performed by attaching a jumper to this end or, more specifically, to conductive elements provided at this free end. In other embodiments, this interconnection can be made within junction box 516 (for example, by interconnecting leads 514*d* and 515*d*). In this example, conductive elements 512 and 514 remain unconnected to external conductive elements.

In certain embodiments, a flexible photovoltaic module includes an electronic control unit configured to establish an electrical connection between a conductive element and one or more photovoltaic cells at some point during installation. For example, the control unit may keep the conductive element disconnected from the one or more photovoltaic cells until a predetermined signal is received during installation. Once the signal is received, the connection is provided. The signal may be supplied wirelessly or through already established electrical connections in the module. The electrical connections established by the electronic control unit may be similar to the ones described above with reference to FIGS. 5A-5C.

Flexible photovoltaic module 500 may also include bypass diodes, inverters, DC/DC converters, and/or various combinations of these components (not shown in FIGS. 5A-5C). A typical bypass diode is configured to prevent an electrical current from flowing back into the cells that are connected to the diode but are not generating electrical power, for example, due to shading, cell failure, and other reasons. An electrical resistance of the shaded cells is greater than that of the bypass diode, and the electrical current is passed ("shunted") through the diode instead of passing through the cells, which could damage the cells in certain situations. Each photovoltaic cell may have a dedicated bypass diode or a group of cells may share one diode.

Furthermore, one or more DC/DC converters may be integrated into module 500. A DC/DC converter may be associated with one photovoltaic module or a set of modules. The DC/DC converter converts an input DC voltage into a higher or lower DC voltage level required by, for example, a central inverter. The central inverter may also be a part of the module and be connected to a grid or other AC electrical systems. For example, several DC/DC converters can be connected to the central inverter by conductive elements described above. The DC/DC converters allow each module (or each set of modules) to operate at its optimum current/voltage regime. The DC/DC converter may operate in a "buck" or "boost" mode, as appropriate. In certain embodiments, a module includes a buck converter connected to a boost converter.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A flexible photovoltaic module comprising:
   a front side flexible sealing sheet having a front sheet edge;
   a back side flexible sealing sheet sealed with respect to the flexible front side flexible sealing sheet to form a sealed space, wherein an edge seal defines at least a part of the boundary of the sealed space;
   one or more flexible photovoltaic cells positioned in the sealed space between the front side flexible sealing sheet and the back side flexible sealing sheet;
   an electrical lead electrically connected to the one or more flexible photovoltaic cells and extending outside of the sealed space and through the front sheet edge and the edge seal;
   a flap attached to the sealed space and extending on the opposite side of the front sheet edge with respect to the sealed space; and
   a junction box attached to the flap, wherein the electrical lead protrudes through the front sheet edge and into the junction box and wherein at least a portion of the junction box is in direct contact with the edge seal.

2. The flexible photovoltaic module of claim 1, wherein the back side flexible sealing sheet extends beyond the front sheet edge with respect to the sealed space to form at least a portion of the flap.

3. The flexible photovoltaic module of claim 2, wherein the flap further comprises a top portion attached to a portion of the back side flexible sealing sheet extending beyond the front sheet edge with respect to the sealed space.

4. The flexible photovoltaic module of claim 3,
   wherein the top portion and the back side flexible sealing sheet comprise a multilayered film comprising a first layer and a second layer; and
   wherein the first layer of the multilayered film of the top portion is facing and attached to the first layer of the multilayered film of the back side flexible sealing sheet.

5. The flexible photovoltaic module of claim 2, wherein the back side flexible sealing sheet has a different composition than the front side flexible sealing sheet.

6. The flexible photovoltaic module of claim 5, wherein the back side flexible sealing sheet does not contain a fluoro-polymer.

7. The flexible photovoltaic module of claim 5, wherein the back side flexible sealing sheet comprises one or more materials selected from the group consisting of polypropyelene, ethylene propylene diene monomer, and santoprene.

8. The flexible photovoltaic module of claim 1, wherein the front side the flap is free from fluorine.

9. The flexible photovoltaic module of claim 1, wherein a thickness of the back side flexible sealing sheet is less than 40 mils.

10. The flexible photovoltaic module of claim 1, further comprising an adhesive provided on a back surface of the back side flexible sealing sheet.

11. The flexible photovoltaic module of claim 1, further comprising a base sheet attached to a back surface of the back side flexible sealing sheet and extending outside of boundaries of the back side flexible sealing sheet.

12. The flexible photovoltaic module of claim 1, further comprising a puncture resistant structure extending above the electrical lead at least at a location where the electrical lead protrudes through the front sheet edge.

13. The flexible photovoltaic module of claim 12, wherein the puncture resistant structure comprises a polyethylene terephthalate film.

14. The flexible photovoltaic module of claim 12, wherein the puncture resistant structure extends into the junction box.

15. The flexible photovoltaic module of claim 12, wherein the puncture resistant structure extends in between the front side flexible sealing sheet and the back side flexible sealing sheet.

16. The flexible photovoltaic module of claim 1, further comprises an adhesive bonding the junction box to the back side flexible sealing sheet.

17. The flexible photovoltaic module of claim 1, wherein a gap between the junction box and the front sheet edge is filled with a sealant.

18. The flexible photovoltaic module of claim 1, wherein the junction box extends over the front sheet edge of the front side flexible sealing sheet.

19. The flexible photovoltaic module of claim 1, wherein a front surface of the flap has a light reflecting color.

20. A flexible photovoltaic module comprising:
a front side flexible sealing sheet having a front sheet edge;
a back side flexible sealing sheet sealed with respect to the flexible front side flexible sealing sheet to form a sealed space, wherein an edge seal defines at least a part of the boundary of the sealed space;
one or more flexible photovoltaic cells positioned in the sealed space between the front side flexible sealing sheet and the back side flexible sealing sheet;
an electrical lead electrically connected to the one or more flexible photovoltaic cells and extending outside of the sealed space and through the front sheet edge and the edge seal;
a flap attached to the sealed space and extending on the opposite side of the front sheet edge with respect to the sealed space; and
a junction box attached to the flap, wherein the electrical lead protrudes through the front sheet edge and into the junction box, wherein at least a portion of the junction box is in direct contact with the edge seal, and wherein the junction box comprises a tapered edge extending into at least a part of the edge seal.

* * * * *